(12) United States Patent
Waldo

(10) Patent No.: US 10,557,870 B2
(45) Date of Patent: Feb. 11, 2020

(54) APPARATUS AND METHOD FOR TIME CORRELATED SIGNAL ACQUISITION AND VIEWING

(71) Applicant: TEKTRONIX, INC., Beaverton, OR (US)

(72) Inventor: Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/294,522

(22) Filed: Oct. 14, 2016

(65) Prior Publication Data

US 2017/0030945 A1  Feb. 2, 2017

Related U.S. Application Data

(63) Continuation of application No. 13/403,319, filed on Feb. 23, 2012, now Pat. No. 9,500,676.

(60) Provisional application No. 61/525,492, filed on Aug. 19, 2011.

(51) Int. Cl.
*G01R 13/02* (2006.01)

(52) U.S. Cl.
CPC ....... *G01R 13/0236* (2013.01); *G01R 13/029* (2013.01)

(58) Field of Classification Search
CPC ............. G01R 13/029; G01R 13/0236; G01R 21/005; G01R 21/006; G01R 21/10; G01R 31/31725; G01R 31/31727; G01R 13/02; G06T 11/20; G06T 11/206; G06F 3/0481; G06F 17/246; G06F 3/147; H04L 41/22; H04L 5/0048; H04L 27/2627; H04L 5/0005; H04L 5/005; H04L 1/0036; H04L 25/0228; H04L 27/2613; H04L 25/022; H04L 27/2614; H04L 27/2626; H04L 27/2602; H04L 27/3845; H04W 24/08; H04W 72/0453; H04B 7/0413; G02B 6/10; H03G 3/348; H04N 21/4305; H04N 5/126

See application file for complete search history.

(56) References Cited

U.S. PATENT DOCUMENTS

| | | | |
|---|---|---|---|
| 7,650,589 B2 * | 1/2010 | Cifra | G06F 3/0486 715/771 |
| 2002/0183948 A1 * | 12/2002 | Qian | G01H 1/003 702/75 |
| 2010/0153044 A1 * | 6/2010 | Nara | G01R 13/0236 702/76 |

\* cited by examiner

*Primary Examiner* — Xilin Guo
(74) *Attorney, Agent, or Firm* — Miller Nash Graham & Dunn; Andrew J. Harrington

(57) ABSTRACT

A test and measurement instrument and method are disclosed. The test and measurement instrument includes a display having a time domain graticule and a frequency domain graticule. A processor is configured to sample an input signal to generate a time domain waveform for display in the time domain graticule. The processor is also configured to generate a frequency domain waveform for display in the frequency domain graticule, the frequency domain waveform being correlated to a selected time period of the time domain graticule. The processor is also configured to generate a spectrum time indicator configured to graphically illustrate a location and the selected time period of the time domain graticule with respect to the frequency domain waveform.

20 Claims, 8 Drawing Sheets

APPARATUS AND METHOD FOR TIME CORRELATED SIGNAL ACQUISITION AND VIEWING

CROSS-REFERENCE TO PRIOR FILED APPLICATIONS

This application is a continuation of and claims priority to U.S. patent application Ser. No. 13/403,319, filed Feb. 23, 2012, titled "APPARATUS AND METHOD FOR TIME CORRELATED SIGNAL ACQUISITION AND VIEWING," which claims priority to U.S. Provisional Application No. 61/525,492, filed Aug. 19, 2011, the disclosures of both of which are incorporated herein by reference in their entirety.

FIELD OF INVENTION

This invention relates to the field of test and measurement instruments and in particular test and measurement instruments configured for time correlated signal acquisition and viewing of digitized waveforms.

BACKGROUND

Modern digital oscilloscopes generally provide the capability to generate a time domain waveform of a given input signal. Some instruments may include the capability to generate a spectrum or frequency domain display of the input signal. A digital processor within the oscilloscope generally performs a frequency domain transform on the input signal to generate the frequency domain display. Existing devices lack an effective way to simultaneous display time domain and frequency domain waveforms and the relationship between the two waveforms. Accordingly, there exists a need for a test and measurement instrument including such simultaneous time domain and frequency domain display capabilities.

SUMMARY OF THE INVENTION

A test and measurement instrument and method are disclosed. The test and measurement instrument includes a display having a time domain graticule and a frequency domain graticule. A processor is configured to process an input signal to generate a time domain waveform for display in the time domain graticule. The input signal is correlated to a time base. The processor is configured to process a second input signal and generate a frequency domain waveform for display in the frequency domain graticule. The second input signal is also correlated to the time base. The frequency domain waveform is correlated to a selected time period of the time base. The processor is configured to generate a spectrum time indicator configured to graphically illustrate a location and the selected time period in the time domain graticule with respect to the frequency domain waveform.

The first input signal and the second input signal may be the same signal. The spectrum time indicator has a width that indicates the selected time period of the time domain graticule with respect to the frequency domain waveform.

The test and measurement instrument may also include a pan input configured to move the spectrum time indicator to a second location, the processor being configured to update the frequency domain waveform based on the second location. The test and measurement instrument may include a zoom input configured to increase a zoom level and magnify the time domain waveform. The processor may be configured to center the spectrum time indicator as the zoom level is increased or the zoom position is panned.

The test and measurement instrument may also include an input configured to receive the input signal and a plurality of user controls.

DETAILED DESCRIPTION OF THE INVENTION

The disclosure is directed to improved control systems for test and measurement instruments such as an oscilloscope. Improved spectrum controls are disclosed. Such controls, link spectrum waveform generation functions to intuitive pan/zoom controls to improve the capability and usability of test and measurement instruments.

Time correlated acquisition and viewing of analog, digital, and RF signals may be accomplished in a single instrument. This is done by splitting the display into two graticules, one for time domain waveforms and one for frequency domain waveforms. The user is provided with indicia that indicate the time period in the time domain from which the spectrum (frequency domain) wave form is calculated. The user is also provided with a mechanism configured to move the spectrum time throughout the acquired data to see how the frequency domain waveforms change over time and how they change relative to other events occurring in the device under test. For example, the user may want to position the spectrum time coincident with a glitch on the power supply to investigate radiated noise. Within the same acquisition they may want to slide the spectrum time through the time period that an RF signal was activated to view characteristics of the turn-on behavior. Regardless of the particular case, it is beneficial to provide the user with the ability to see the spectrum time aligned with other system activity being probed with analog and digital channels.

The following definitions may be helpful in understanding this disclosure.

Analog time: the amount of time represented in the time domain graticule. Analog time may be set by a Horizontal Scale knob.

RF Acquisition time: the amount of time being acquired on a radio frequency (RF) input. RF Acquisition time may be more, less or the same as Analog time depending on the particular setup.

Spectrum time: the amount of RF acquisition time used to calculate the spectrum shown in the frequency domain graticule. In a typical embodiment, Spectrum time may be as long as, but not longer than the RF acquisition time. Spectrum time may be determined by dividing the FFT window factor by the resolution bandwidth.

Spectrum position: the starting location of the spectrum time relative to analog time.

Center screen: with zoom off, center screen refers to the center of the time domain acquisition. With zoom on, center screen refers to the center of the zoom box.

Figure 1:
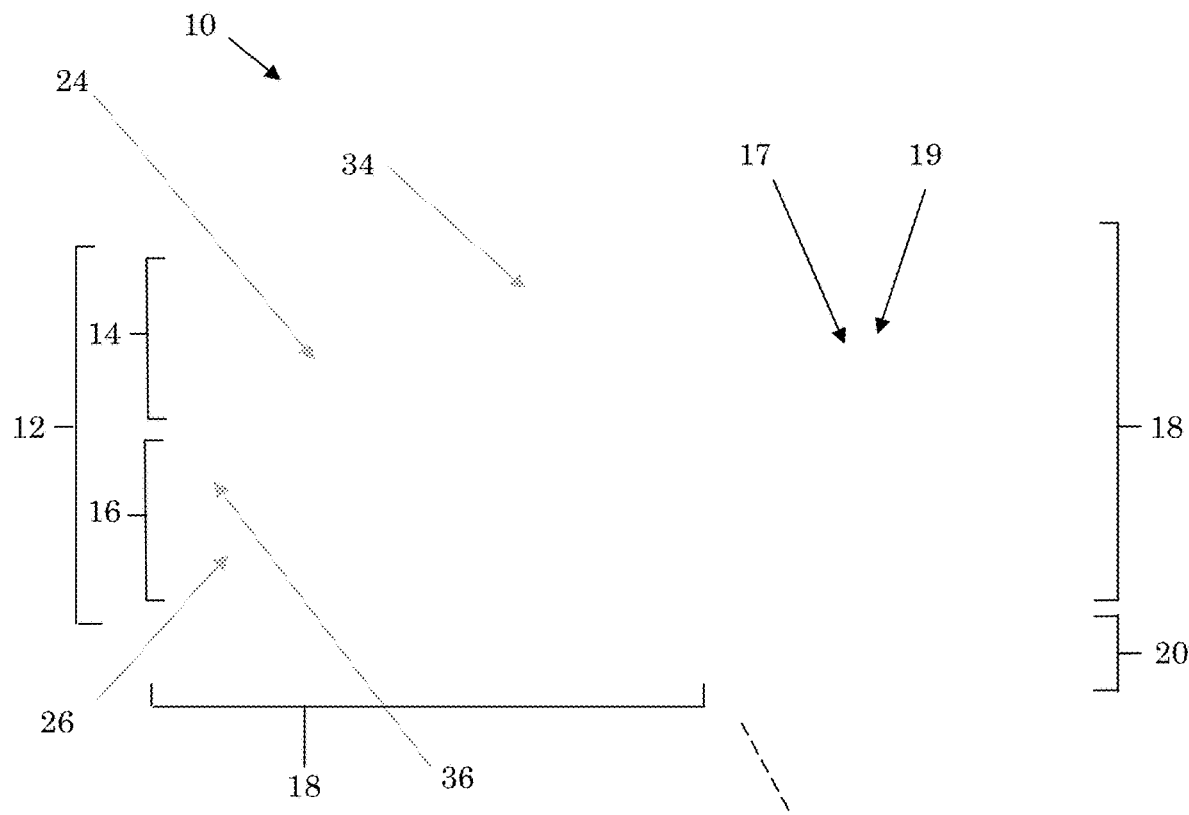
FIG. 1 is a diagram of an oscilloscope having a display that is divided into a plurality of graticules.
Figure 1:
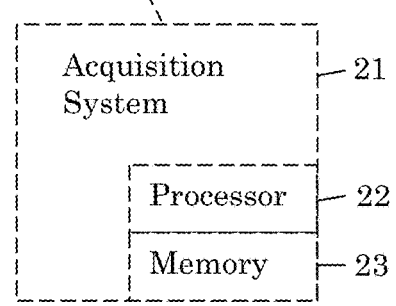

FIG. 1 is a diagram of an oscilloscope 10 having a display 12 that is divided into a plurality of graticules 14, 16. The graticules 14, 16 are configured to graphically display at least one waveform 24, 26 and other graphical indicia 34, 36 for example axes, graphical information and text. The oscilloscope 10 also has a plurality of user controls 18 configured for user input and a plurality of electrical inputs 20 configured to receive test signals and the like. In this example, user controls 18 include a zoom input 17 (inner knob) and a pan input 19 (outer knob) configured to vary the zoom factor and pan position (zoom box position).

In this example, the oscilloscope 10 is implemented as a stand-alone unit with an acquisition system 21 including a processor 22 having an associated memory 23 configured for storage of program information and data. It should be understood that processor 22 may be coupled to additional circuitry, e.g., I/O, A/D, graphics generation hardware and the like. The processor 22 is configured to receive at least a portion of the inputs via the user controls 18. The processor is also configured to generate at least a portion of the information displayed in the graticules 14, 16. It should be understood that the oscilloscope may be implemented using a variety of hardware and software including embodiments implemented using a computing devices, e.g., desktop, laptop, tablet, smart phone or other computing devices.

Figure 2:
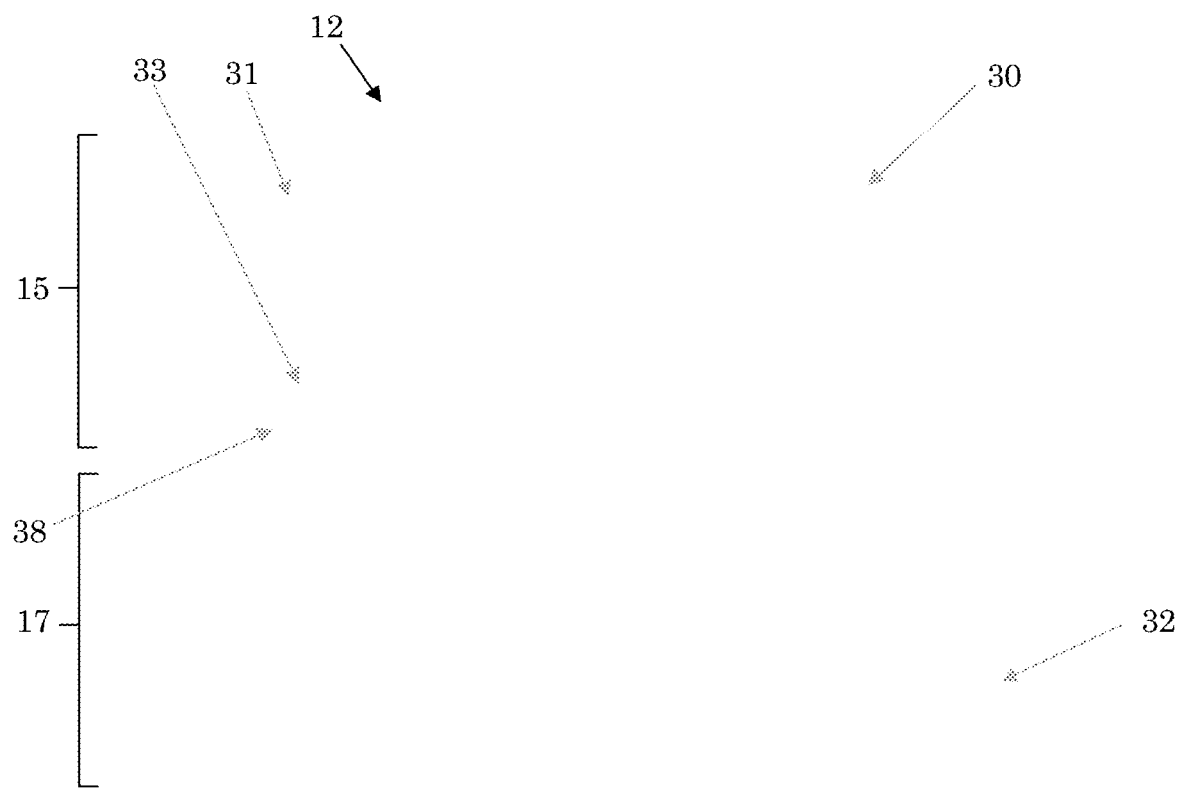
FIG. 2 is a detailed diagram of a display that is divided into a plurality of graticules.

FIG. 2 is a detailed diagram of a display 12 that is divided into a plurality of graticules. In this example, the upper graticule is a time domain graticule 15 that is configured to display a time domain waveform 30 representing a time domain signal supplied to one of electrical inputs 20. In this example, the display 12 is configured to simultaneously display several individual time domain waveforms from separate signals applied to electrical inputs 20 as shown by reference numbers 31, 33. The lower graticule is a frequency domain graticule 17 that is configured to display a frequency domain waveform 32 from a signal applied to one of electrical inputs 20 for at least a portion of the time represented in the time domain graticule 15. In this example, the time domain waveforms 30, 31, 33 as well as the frequency domain waveform 32 all represent different input signals, e.g., different input channels. It should be understood that one input signal may be used to generate both a time domain waveform and a frequency domain waveform. The display 12 also includes a spectrum time indicator 38 that is configured to graphically illustrate the time period associated with the associated frequency domain waveform 30.

Figure 3A:
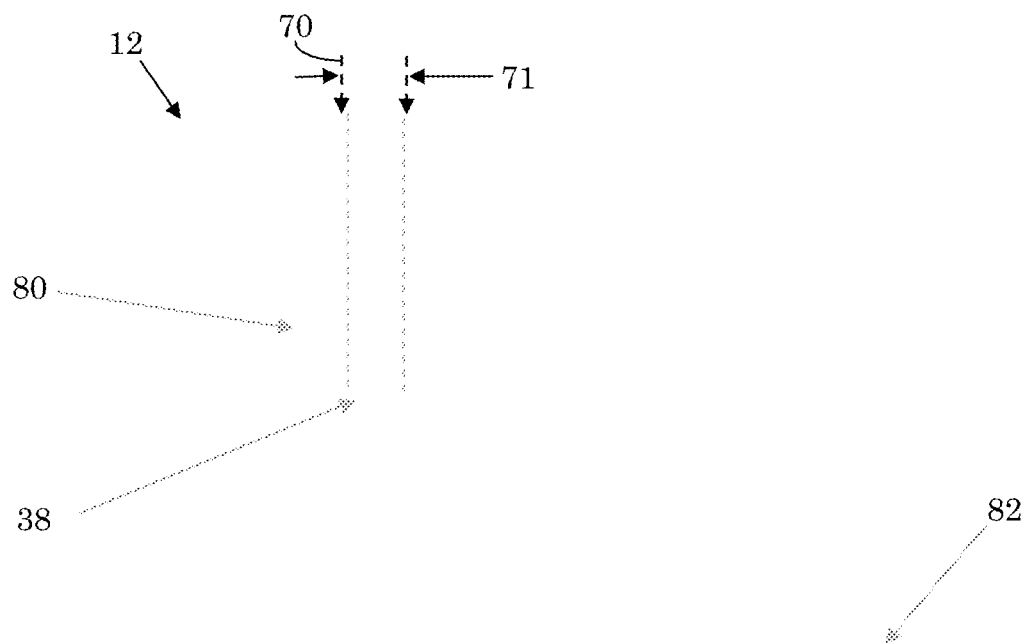
FIGS. 3A-3D are diagrams showing how spectrum time panning results in a modified frequency domain waveform.

FIGS. 3A-3D are diagrams showing how spectrum time panning and variation in spectrum time results in a modified frequency domain waveform. The upper graticule shows a time domain waveform 80 of an RF input signal (signal under test). It should also be understood that the input signal is sampled and stored by oscilloscope 10 for subsequent analysis using the improved spectrum controls disclosed herein. FIG. 3A is an example showing the spectrum time indicator 38 having a starting position located at a first location 70. The spectrum time indicator 38 has a width 71 that indicates the actual spectrum time relative to the time domain waveform 80. In this example, the time domain waveform 80 and frequency domain waveform 82 are derived from the same input signal. The frequency domain waveform 82 has a peak amplitude frequency of approximately 2.397 GHz.

Figure 3B:
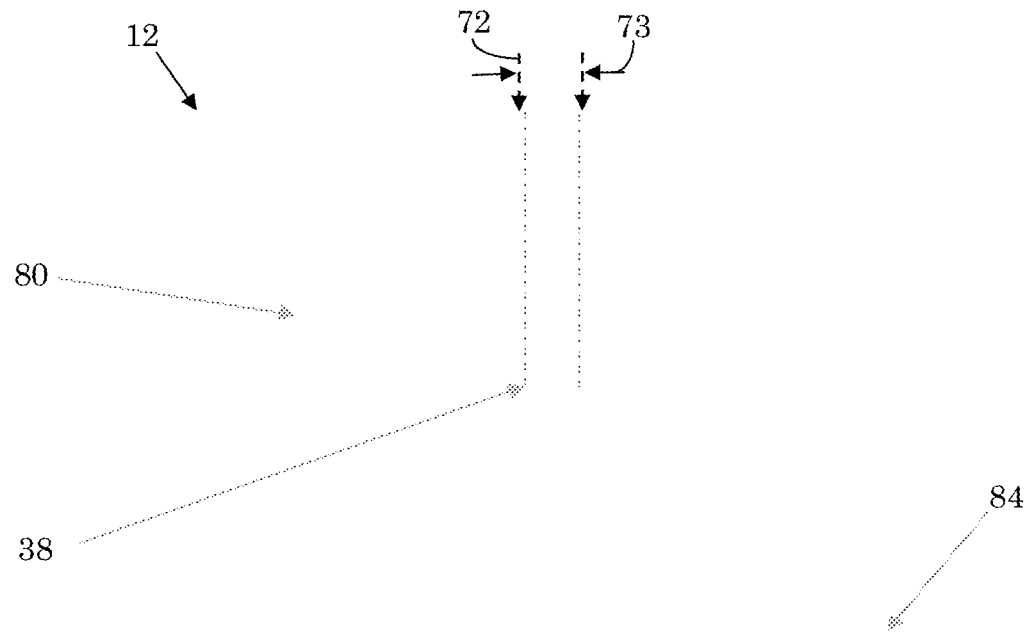

As the spectrum time indicator 38 is moved to the right, the frequency domain waveform is updated to reflect the spectrum for that starting location and duration. FIG. 3B is an example showing the spectrum time indicator 38 having a starting position located at a second location 72. The spectrum time indicator 38 has a width 73 that indicates the actual spectrum time relative to the time domain waveform 80. In this example, the frequency domain waveform 84 has a peak amplitude frequency of approximately 2.400 GHz.

Figure 3C:
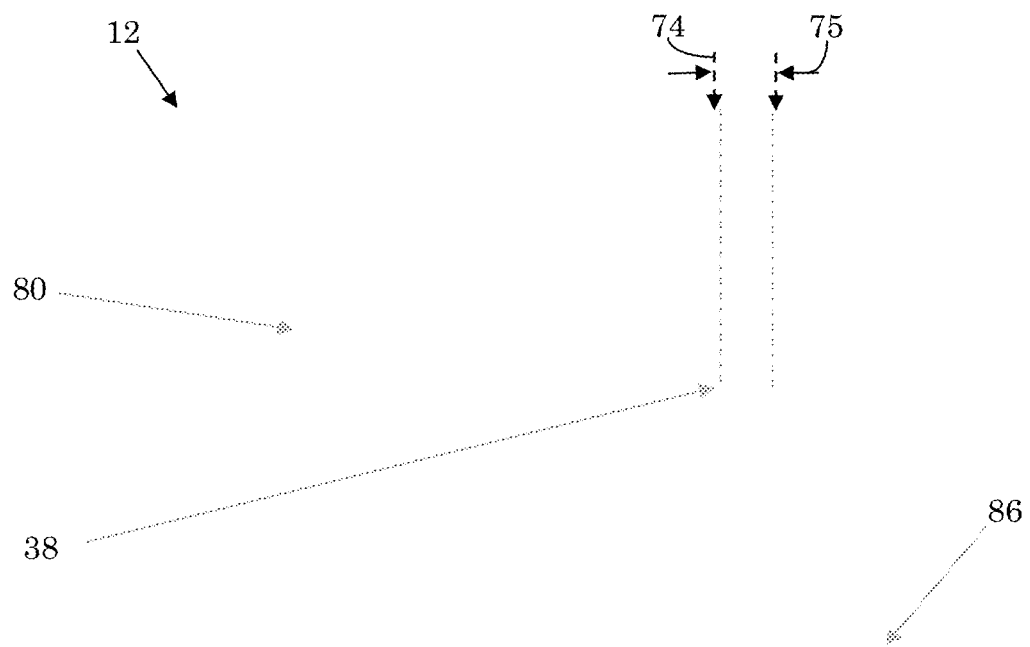

Continuing with this example, FIG. 3C is an example showing the spectrum time indicator 38 having a starting position located at a third location 74. The spectrum time indicator 38 has a width 75 that indicates the actual spectrum time relative to the time domain waveform 80. In this example, the frequency domain waveform 86 has a peak amplitude frequency of approximately 2.403 GHz.

Figure 3D:
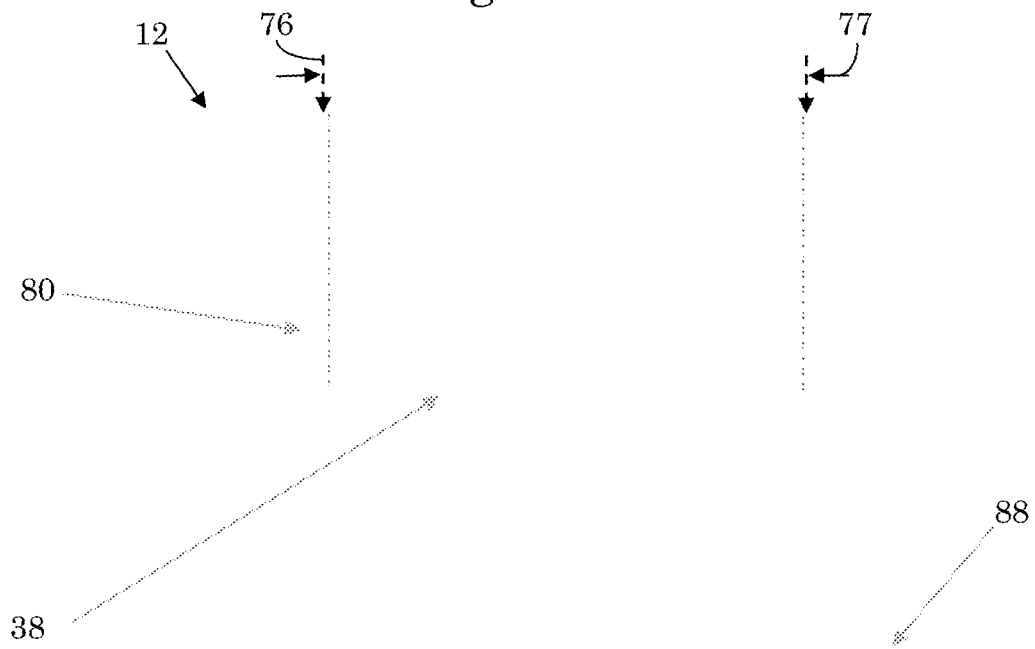

Finally, FIG. 3D is an example showing the spectrum time indicator 38 having a starting position located at a fourth location 76. The spectrum time indicator 38 has a width 77 that indicates the actual spectrum time relative to the time domain waveform 80. In this example, the frequency domain waveform 88 has a peak amplitude frequency of approximately 2.40 GHz but also has a stepped appearance since the spectrum time now encompasses all three plateaus in the time domain waveform 80.

Figure 4:
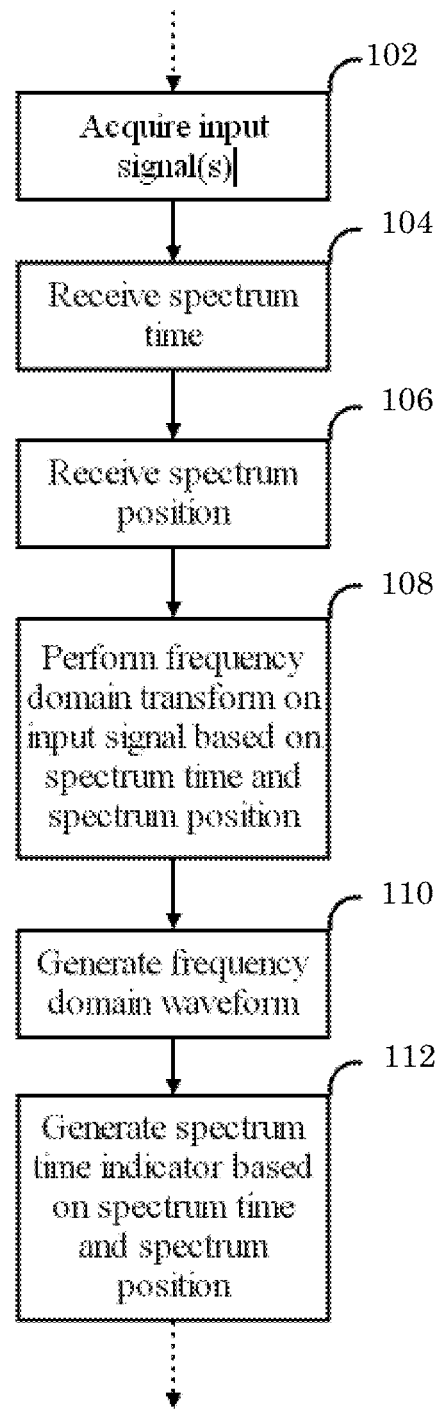
FIG. 4 is a flowchart showing the general processing steps to generate a frequency domain waveform and spectrum time indicator.

FIG. 4 is a flowchart showing the general processing steps to carry out the functions disclosed above. It should be understood that any flowcharts contained herein are illustrative only and that other program entry and exit points, time out functions, error checking routines and the like (not shown) would normally be implemented in typical system software. It is also understood that system software may run continuously after being launched. Accordingly, any beginning and ending points are intended to indicate logical beginning and ending points of a portion of code that can be integrated into a main program and executed as needed. The order of execution of any of the blocks may also be varied without departing from the scope of this disclosure. Implementation of these aspects is readily apparent and well within the grasp of those skilled in the art based on the disclosure herein.

One or more input signals are acquired, e.g., digitized and stored in memory, as shown by block 102. The digitized input signal(s) generally include a series of samples having a known time base. The spectrum time and spectrum position are determined as shown by blocks 104, 106 respectively. Spectrum time and position may be received via front panel controls such as zoom input 17 (inner knob) and a pan input 19 (outer knob) shown in FIG. 1. It should be understood that the spectrum time and spectrum position may be set to initial default values if no user input is received.

The processor performs a frequency domain transform, e.g., fast Fourier transform (FFT), on the input signal. The spectrum time and spectrum position inputs are used to identify corresponding input signal samples for this time period as shown by block 108. A frequency domain waveform is generated as shown by block 110. The spectrum time indicator is then generated and overlaid on the display to graphically represent the spectrum time and spectrum position as shown by block 112.

The improved spectrum controls disclosed above may be implemented in an oscilloscope having zoom functionality. In such an embodiment, the RF acquisition position and spectrum position may default to center screen. This means that when zoom is off, the RF acquisition position and the spectrum position is centered on center screen. When zoom is on, the RF acquisition position and spectrum position is centered on the center of the zoomed portion of the display (zoom box). The RF acquisition position and spectrum position may be indicated visually to the user. When spectrum time is less than RF acquisition time, spectrum position may be adjusted anywhere within the RF acquisition time as shown generally in the examples above. When RF acquisition time is less than analog time, the RF acquisition time can be adjusted anywhere within analog time (within hardware capabilities of the oscilloscope).

By default the spectrum position may be set to center screen. Therefore when zoom is off, spectrum position is the center of the display, but can be panned via the pan input 19. When zoom is on, spectrum position is centered on the zoom box. When the user pans the zoom box, e.g., via pan input 19 shown in FIG. 1, spectrum position pans with it. This allows the user to always see time correlated analog, digital, and RF.

Figure 5A:
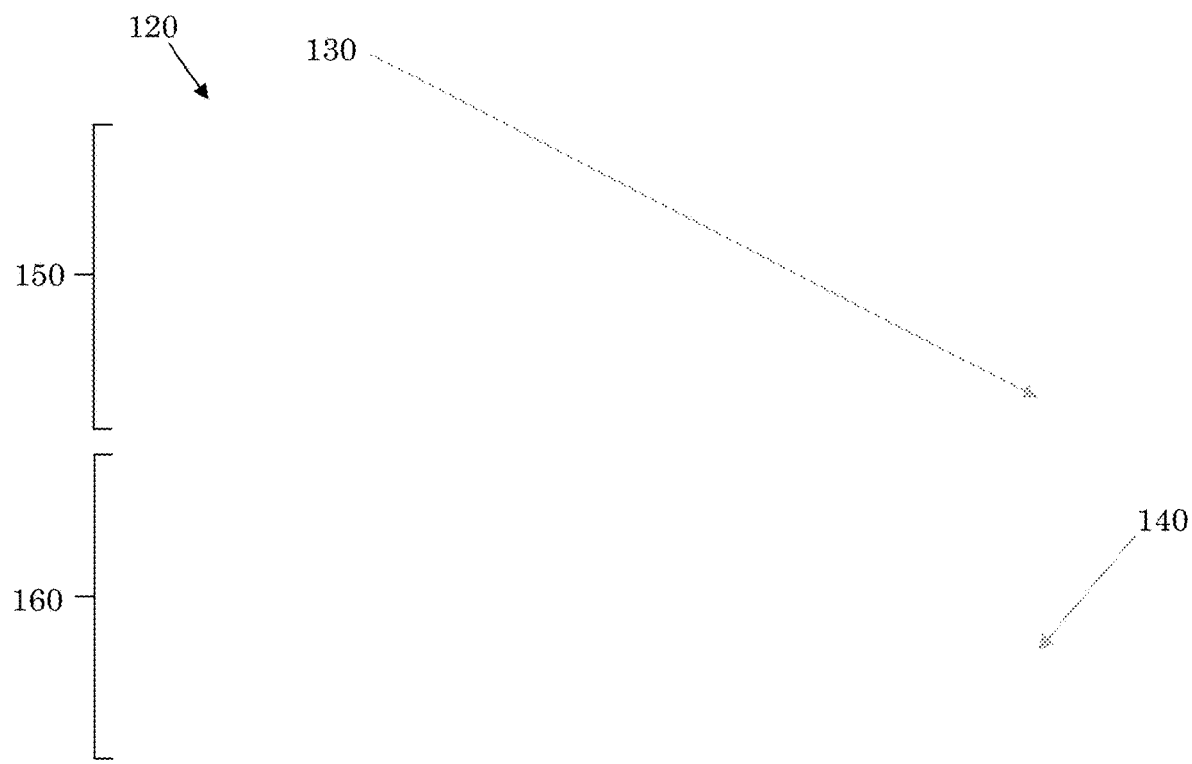
FIGS. 5A-5C are diagrams showing how zooming results in a modified frequency domain waveform.
Figure 5B:
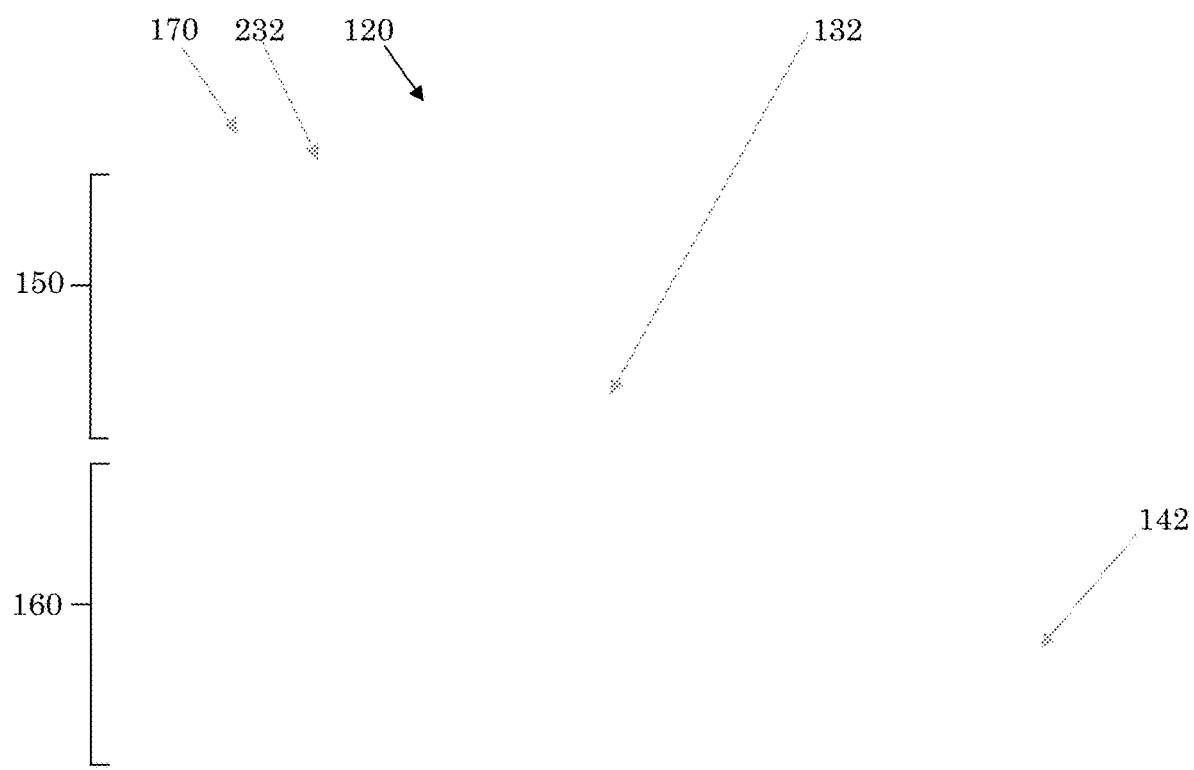
Figure 5C:
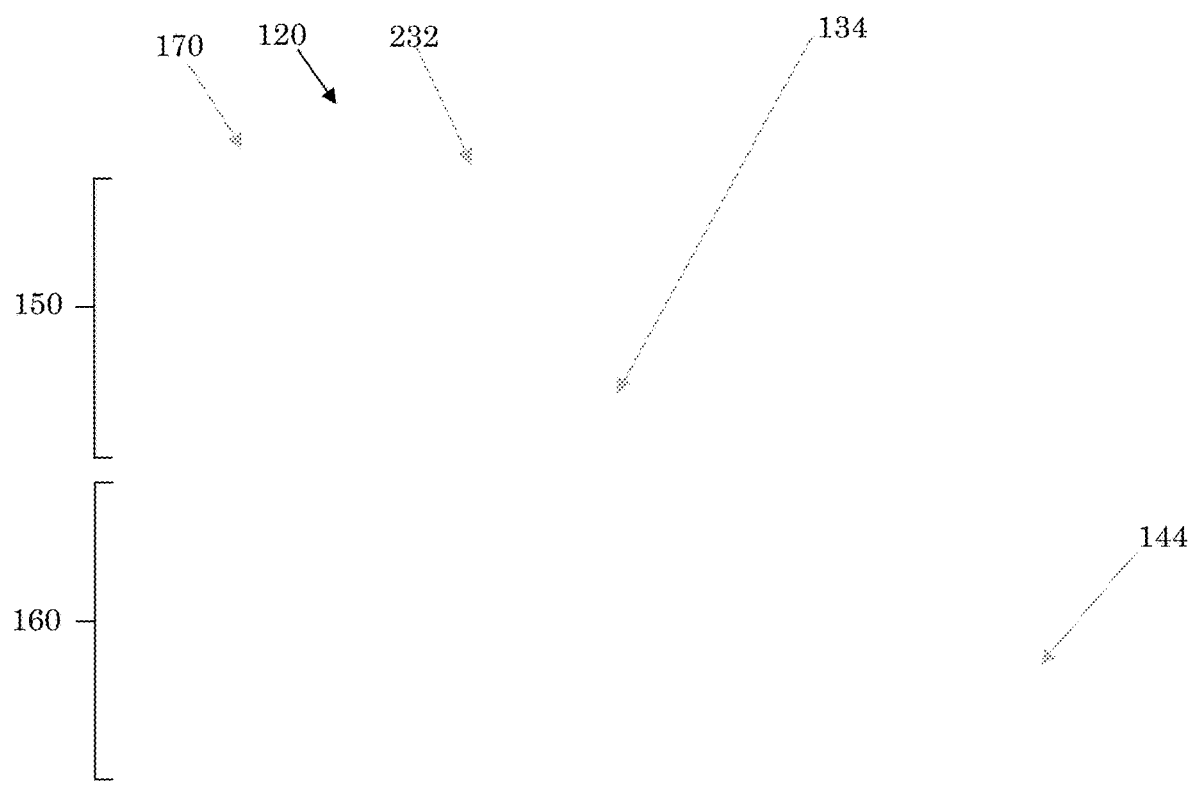

FIGS. 5A-5C are diagrams showing how zooming results in a modified frequency domain waveform. FIG. 5A shows a display 120 prior to zooming. The display 120 is divided into a time domain graticule 150 and a frequency domain graticule 160. A spectrum time indicator 130 is located towards the right hand side of the display 120. Frequency domain waveform 140 is taken from this portion of the time base.

FIG. 5B shows a display 120 after zooming. It should be understood that the spectrum time was also panned to the left hand portion of the display 120. The display may provide an analog time graticule 170 that shows all of the analog capture time. A second spectrum time indicator 232 may be provided to illustrate the position of the spectrum time with respect to the analog time. Frequency domain waveform 142 is taken from this portion of the analog time. The zoomed spectrum time indicator 132 is shown as a larger portion of the display 120. The spectrum time indicator 132 remains centered in the time domain graticule 150 and frequency domain graticule as the zoom level is increased.

FIG. 5C shows a display 120 after panning. In this example, the spectrum time is moved to the right as shown by the second spectrum time indicator 232. Frequency domain waveform 144 is taken from this portion of the analog time. The spectrum time indicator 134 remains centered in the zoomed view of the time domain graticule 150 and the frequency domain waveform 144 updates as the pan control is altered.

It should be understood that many variations are possible based on the disclosure herein. Although features and elements are described above in particular combinations, each feature or element can be used alone without the other features and elements or in various combinations with or without other features and elements. The methods or flow charts provided herein may be implemented in a computer program, software, or firmware incorporated in a computer-readable (non-transitory) storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A test and measurement instrument, comprising:
a display having a time domain graticule and a frequency domain graticule;
one or more inputs configured to receive one or more signals from one or more devices under test;
an acquisition system configured to digitize the one or more signals into signal samples having a time base; and
a processor configured to:
generate a time domain waveform from a first series of the signal samples for display in the time domain graticule;
receive input from a user identifying a time period within the time domain waveform;
select a second series of the signal samples based on the time base of the signal samples that correspond to the identified time period; and
perform a frequency domain transform on the second series of the signal samples to generate a frequency domain waveform for display in the frequency domain graticule.

2. The test and measurement instrument of claim 1, wherein the processor is further configured to: receive user input that modifies the time period and dynamically update the frequency domain waveform based on the modified time period.

3. The test and measurement instrument of claim 2, wherein the processor is further configured to generate a spectrum time indicator that graphically illustrates a location of the identified time period within the time domain graticule, and wherein to receive input that modifies the time period includes movement of the spectrum time indicator by a user along a time axis of the time domain waveform.

4. The test and measurement instrument of claim 3, further comprising a pan input configured to cause the movement of the spectrum time indicator.

5. The test and measurement instrument of claim 3, further comprising a zoom input configured to increase a zoom level and magnify the time domain waveform to create a zoomed view.

6. The test and measurement instrument of claim 5, wherein the processor is further configured to center the spectrum time indicator in the zoomed view as the zoom level is increased.

7. The test and measurement instrument of claim 5, wherein the processor is further configured to center the spectrum time indicator in the zoomed view as the magnified time domain waveform is panned.

8. The test and measurement instrument of claim 1, wherein the first series of signal samples is produced from a first signal and the second series of signal samples is produced from a second signal, and wherein the first signal and the second signal are different signals.

9. The test and measurement instrument of claim 1, wherein the second series of signal samples is a subset of the first series of signal samples.

10. A method of viewing time correlated signal acquisitions comprising:
receiving one or more signals from one or more devices under test;
digitizing the one or more signals into signal samples having a time base;
generating a time domain waveform from a first series of the signal samples for display in the time domain graticule;

receiving input from a user identifying a time period within the time domain waveform;

selecting a second series of the signal samples based on the time base of the signal samples that correspond to with the identified time period; and performing a frequency domain transform on the second series of the signal samples to generate a frequency domain waveform for display in a frequency domain graticule.

11. The method of claim 10, further comprising: receiving user input modifying the time period and dynamically updating the frequency domain waveform based on the modified time period.

12. The method of claim 10, further comprising: generating a spectrum time indicator that graphically illustrates a location of the identified time period within the time domain graticule, and wherein receiving user input modifying the time period includes receiving input from a user moving the spectrum time indicator.

13. The method of claim 12, wherein the user input is a pan input along a time axis of the time domain waveform.

14. The method of claim 12, further comprising: receiving a zoom input to increase a zoom level and, in response, magnifying the time domain waveform to create a zoomed view.

15. The method of claim 14, further comprising: centering the spectrum time indicator in the zoomed view as the zoom level is increased.

16. The method of claim 14, further comprising: centering the spectrum time indicator in the zoomed view as the magnified time domain waveform is panned.

17. A non-transitory computer readable medium having stored thereon a computer program, which, when executed by a processor causes the processor to:
receive one or more signals from one or more devices under test;
digitize the one or more signals into signal samples having a time base;
generate a time domain waveform from a first series of the signal samples for display in a time domain graticule;
receive input from a user selecting a time period within the time domain waveform;
identify a second series of the signal samples based on the time base of the signal samples that correspond to with the selected time period;
generate a frequency domain waveform for display in a frequency domain graticule by performing a frequency domain transform on the second series of the signal samples; and
generate a spectrum time indicator configured to graphically illustrate a location of the selected time period with respect to the time domain waveform.

18. The non-transitory computer readable medium of claim 17, wherein the computer program when executed by the processor further causes the processor to: receive user input that modifies the time period and dynamically update the frequency domain waveform based on the modified time period.

19. The non-transitory computer readable medium of claim 17, wherein the first series of signal samples is produced from a first signal and the second series of signal samples is produced from a second signal, and wherein the first signal and the second signal are different signals.

20. The non-transitory computer readable medium of claim 17, wherein the second series of signal samples is a subset of the first series of signal samples.

* * * * *